United States Patent [19]
Goslicki, Jr. et al.

[11] Patent Number: 6,106,307
[45] Date of Patent: Aug. 22, 2000

[54] PLUGGABLE I/O BREAKOUT CONNECTOR MODULE

[75] Inventors: Daniel P. Goslicki, Jr., Wethersfield; Ramon W. Rosati, Simsbury, both of Conn.

[73] Assignee: Warner Electric Technology, Inc., Richmond, Va.

[21] Appl. No.: 09/086,166

[22] Filed: May 28, 1998

[51] Int. Cl.⁷ .................................................. H01R 12/00
[52] U.S. Cl. ............................................................. 439/76.1
[58] Field of Search .................................. 439/76.1, 709, 439/638, 652

[56] References Cited

U.S. PATENT DOCUMENTS

| | | | |
|---|---|---|---|
| 4,385,791 | 5/1983 | Lovrenich | 439/76.1 |
| 4,558,914 | 12/1985 | Prager et al. | 339/75 R |
| 4,668,898 | 5/1987 | Harms et al. | 318/254 |
| 4,683,454 | 7/1987 | Vollmer et al. | 439/364 |
| 4,869,682 | 9/1989 | Volk et al. | 439/676 |
| 4,988,905 | 1/1991 | Tolmie, Jr. | 310/68 B |
| 5,313,150 | 5/1994 | Arakawa et al. | 318/768 |
| 5,436,799 | 7/1995 | Krieg et al. | 361/733 |
| 5,493,194 | 2/1996 | Damiano et al. | 318/575 |
| 5,500,563 | 3/1996 | Kawaguchi et al. | 310/71 |
| 5,610,493 | 3/1997 | Wieloch | 318/801 |
| 5,623,191 | 4/1997 | Wieloch | 318/801 |
| 5,897,399 | 4/1999 | Emery | 439/709 |

FOREIGN PATENT DOCUMENTS

| | | | |
|---|---|---|---|
| 6-338359 | 12/1994 | Japan . | |
| 2035716 | 6/1980 | United Kingdom | 439/638 |

OTHER PUBLICATIONS

"Step Motor and Servo Motor Systems and Controls", Parker Hannifin Corp., Catalog No. 800–1/USA, pp. B127–B128 and front and back cover, (est. 1997).

"Motion Control Product Catalog 1998", Galil Motion Control Inc., p. 58 and front and back cover, (est. 1997).

"Motion Control Product Guide", Aerotech, Inc. Catalog No. 4, p. 202 and front and back cover, (est. 1993).

"Interface II PLC System Cabling Varioface", Phoenix Contact, Inc., Catalog No. 8—'95/96, pp. 32–33, 84–85, 87, and 104 and front, inside front and inside rear cover (est. 1995).

*Primary Examiner*—Neil Abrams
*Attorney, Agent, or Firm*—Dykema Gossett PLLC

[57] ABSTRACT

A removable adapter (24) for use with a motor control unit (14) having mass-termination connectors (28, 30, 32) is provided. The adapter (24) includes a circuit board (36) having a first side (62) and a second side (64) opposite the first side (62). The adapter (24) further includes terminal strip (38, 40, 42, 44), which may include screw terminals (64), disposed on the first side (62) of the circuit board (36) and mass-termination connectors (46, 48, 50) disposed on the second side (64) of the circuit board (36). The mass-termination connectors (46, 48, 50) of the adapter (24) are configured to directly, matingly engage the mass-termination connectors (28, 30, 32) of the control unit (14). Conduction paths (66) on the circuit board (36) extending between the terminal strips (38, 40, 42, 44) and the mass-termination connectors (46, 48, 50) allow individual wiring and control of signals input to and received from the control unit (14) through the mass-termination connectors (28, 30, 32) of the control unit (14). A mass-termination connector (52) may also be disposed on the first side (62) of the circuit board (36) to enable alternative use of individual wiring and mass-termination connection. Graphical overlays (56, 58, 60) may also be used.

13 Claims, 3 Drawing Sheets

PLUGGABLE I/O BREAKOUT CONNECTOR MODULE

BACKGROUND OF THE INVENTION

1. Field of the Invention

This invention relates to motor control units, and, in particular, to an input/output adapter configured to be mounted directly to the motor control unit to allow discrete wiring of control units having mass-termination connectors.

2. Disclosure of Related Art

It is common in industry today to utilize a programmable motor control unit to generate excitation signals to control the operation of a motor. The control unit typically includes one or more control circuits disposed within a housing and electrically connected to the motor. The control unit also includes an external interface to the control circuits disposed on the front of the control unit. The interface allows the user to program the control circuits by sending input signals to, and receiving output signals from, the control circuits.

The conventional interface for a motor control unit typically includes various connectors, including mass-termination connectors and/or terminal strips, that allow a computer or other programming means to be connected to the control circuits and to transmit signals to and receive signals from the control circuits. Mass-termination connectors provide a single connection for transmitting a plurality of signals. Therefore, such connectors promote ease of assembly between the control unit and programming means. Terminal strips provide individual connections for individual signals. Although terminal strips make the assembly of the control unit and programming means more difficult, the terminal strips allow easier adjustment and control of individual signals. Interfaces for conventional motor control units typically incorporate either mass-termination connectors or terminal strips for transmitting/receiving a given set of input/output signals, but do not incorporate both types of connectors for the same signals. As a result, the user of the motor control unit is restricted to using one type of connector between the control unit and the programming means even though a different type of connector may be more suitable for a particular application. Attempts have been made to provide the benefits of both mass-termination connectors and terminal strips by providing adapters for control units having mass-termination connectors. The adapters typically include terminal strips that can be electrically connected to the mass-termination connectors of the control unit through a cable. Such adapters are typically mounted to the side of the control unit (i.e., not the interface). These conventional adapters are costly in terms of materials, assembly time, and space requirements. Moreover, the interconnecting cables of these adapters generate a significant level of electromagnetic interference.

There is thus a need for an adapter and a motor control unit that will minimize or eliminate one or more of the above-mentioned deficiencies.

SUMMARY OF THE INVENTION

The present invention provides an adapter for a motor control unit.

An object of the present invention is to provide an adapter that enables individual wiring and control of input/output signals in a motor control unit having mass-termination connectors.

Another object of the present invention is to provide an adapter that is configured to be mounted directly (i.e., without a cable) to a motor control unit interface having mass-termination connectors.

An adapter in accordance with the present invention includes a circuit board having a first side and a second side opposite the first side. The adapter also includes a terminal strip disposed on the first side of the adapter. The terminal strip may comprise a plurality of screw terminals that may be individually wired. The adapter further includes a mass-termination connector disposed on the second side of the circuit board. The mass-termination connector includes a plurality of connection members (which may comprise pins or sockets) that are configured to matingly engage with a corresponding plurality of connection members of a mass-termination connector disposed on the control unit.

An adapter in accordance with the present invention is mounted directly onto the interface of the control unit through mating engagement of mass-termination connectors on the control unit and the adapter. One advantage of such an adapter is that it incorporates fewer parts than conventional adapters and is, therefore, less costly in terms of parts and assembly time. Because the adapter can be mounted directly to the front of the unit, it also takes up less space than conventional adapters. Finally, the direct connection between the adapter and the control unit results in a decrease in electromagnetic interference as compared to conventional adapters.

These and other features and objects of this invention will become apparent to one skilled in the art from the following detailed description and the accompanying drawings illustrating features of this invention by way of example.

DETAILED DESCRIPTION OF THE PREFERRED EMBODIMENT

Figure 1:
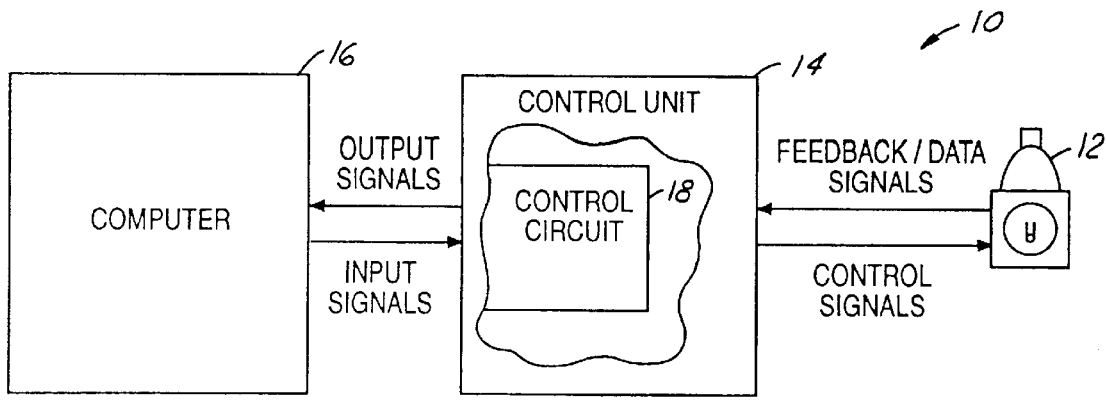
FIG. 1 is a combination plan view and block diagram illustrating a motor control system incorporating a motor control unit in accordance with the present invention.

Referring now to the drawings wherein like reference numerals are used to identify identical components in the various views, FIG. 1 illustrates a motor control system 10. System 10 includes a motor 12, a control unit 14, and means, such as computer 16, for programming control unit 14.

Motor 12 is conventional in the art and may be provided for a wide variety of industrial and other applications. Motor 12 is responsive to electrical control signals generated by control unit 14.

Control unit 14 is also conventional in the art and includes a control circuit 18. Circuit 18 outputs control signals to motor 12 in order to control the operation of motor 12. Circuit 18 may also receive signals from motor 12 as is known in the art (e.g., feedback signals or measured data). Circuit 18 also receives input signals from, and generates output signals to computer 16.

Computer 16 is provided to program control circuit 18 (i.e., transmit input signals or commands to control circuit 18). Computer 16 is conventional in the art. It should be understood by those skilled in the art that a variety of programming means, other than computer 16, may be employed.

Figure 2:
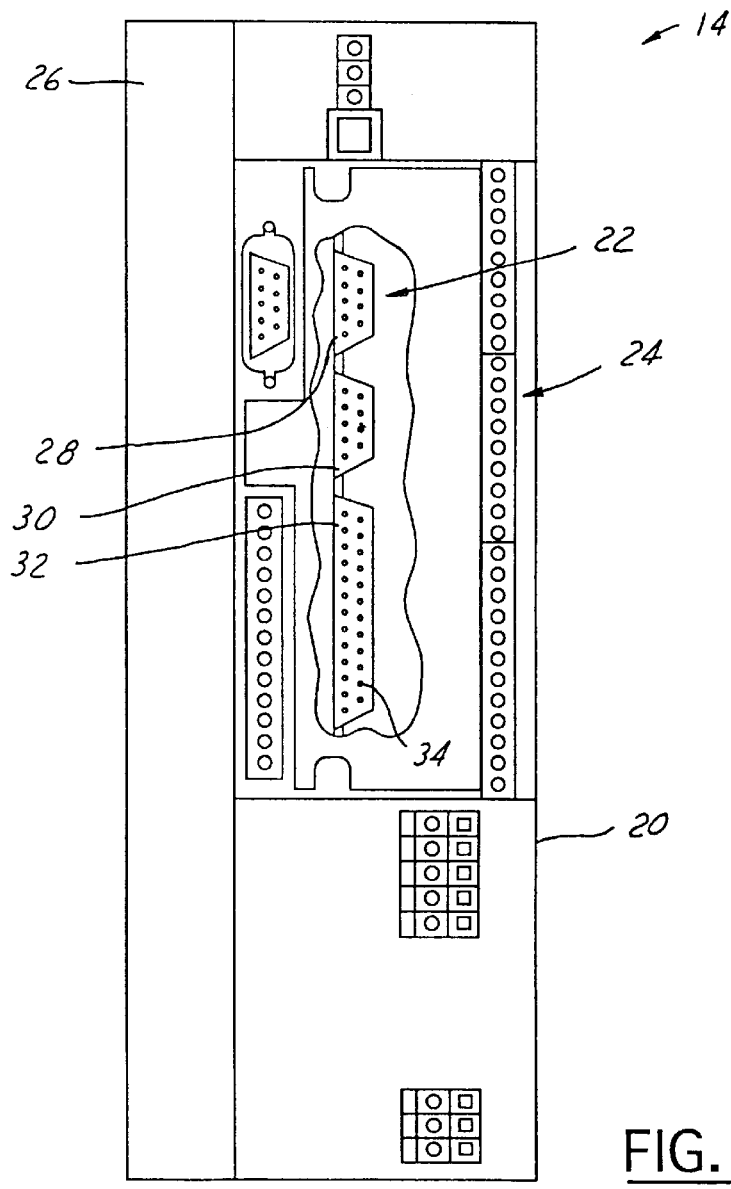
FIG. 2 is a front plan view of a motor control unit in accordance with the present invention.

Referring now to FIG. 2, control unit 14 is shown in greater detail. Unit 14 includes a housing 20 and an interface 22 which may be disposed on the front side of housing 20. Unit 14 may also include an adapter 24 in accordance with the present invention.

Housing 20 is provided to protect the internal components of control unit 14 from foreign objects and elements and to protect users of control unit 14 from contact with energized electrical components of unit 14. Housing 20 may be made from a variety of conventional metals and plastics. Housing 20 may be rectangular in shape-having front and rear walls and a plurality of side walls extending therebetween. Housing 20 may also include a plurality of fins 26 extending from one of the walls of housing 20 to aid in dissipating heat generated by unit 14.

Interface 22 is provided to allow a user of unit 14 to send input signals to and receive output signals from control circuit 18. Interface 22 may be disposed on one wall of housing 20 and may include a plurality of input/output devices including mass-termination connectors 28, 30, 32. Connectors 28, 30, 32 may comprise subminiature D connectors and may have a plurality of connection members 34. In the illustrated embodiment, each of members 34 comprises a socket. It should be understood, however, that members 34 may alternatively comprise pins or other conventional connection means.

Figure 3:
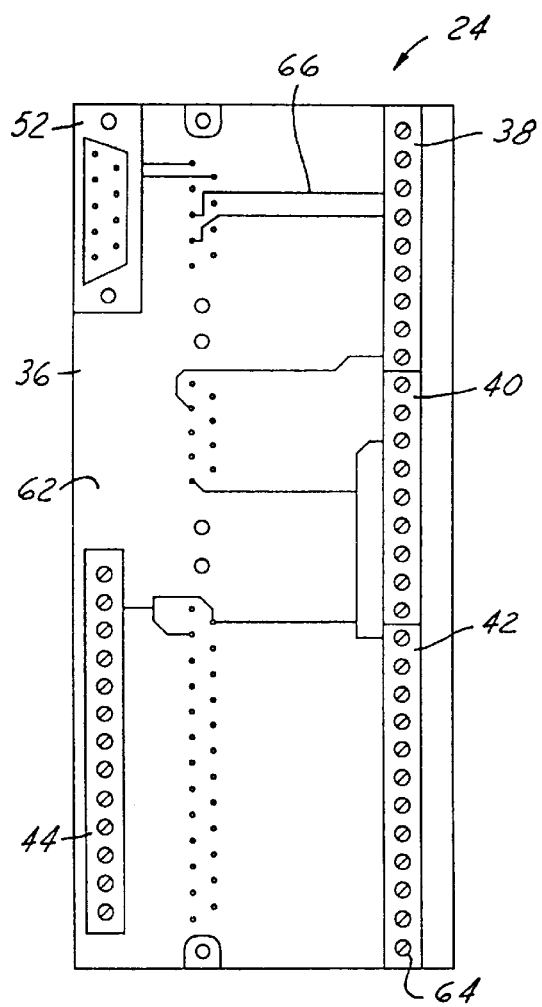
FIG. 3 is a front plan view of an adapter in accordance with the present invention.
Figure 4:
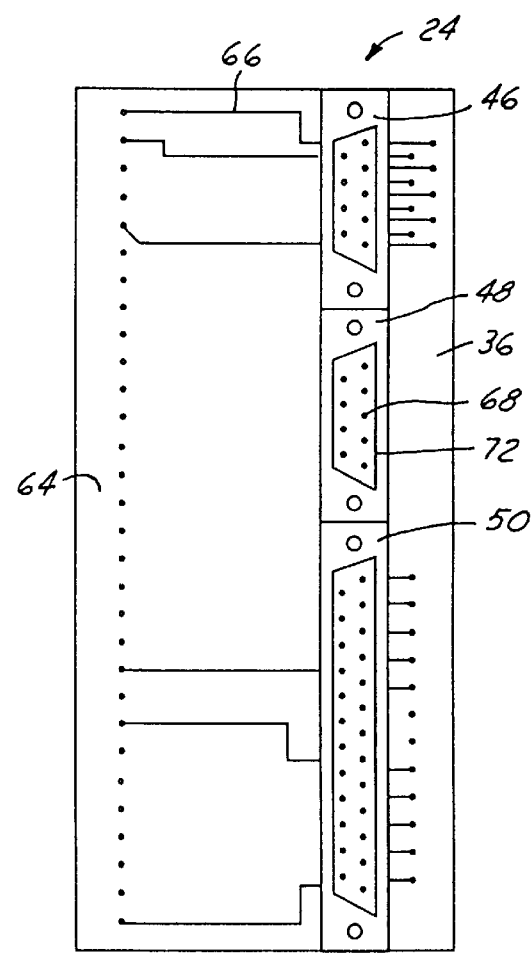
FIG. 4 is a rear plan view of an adapter in accordance with the present invention.
Figure 5:
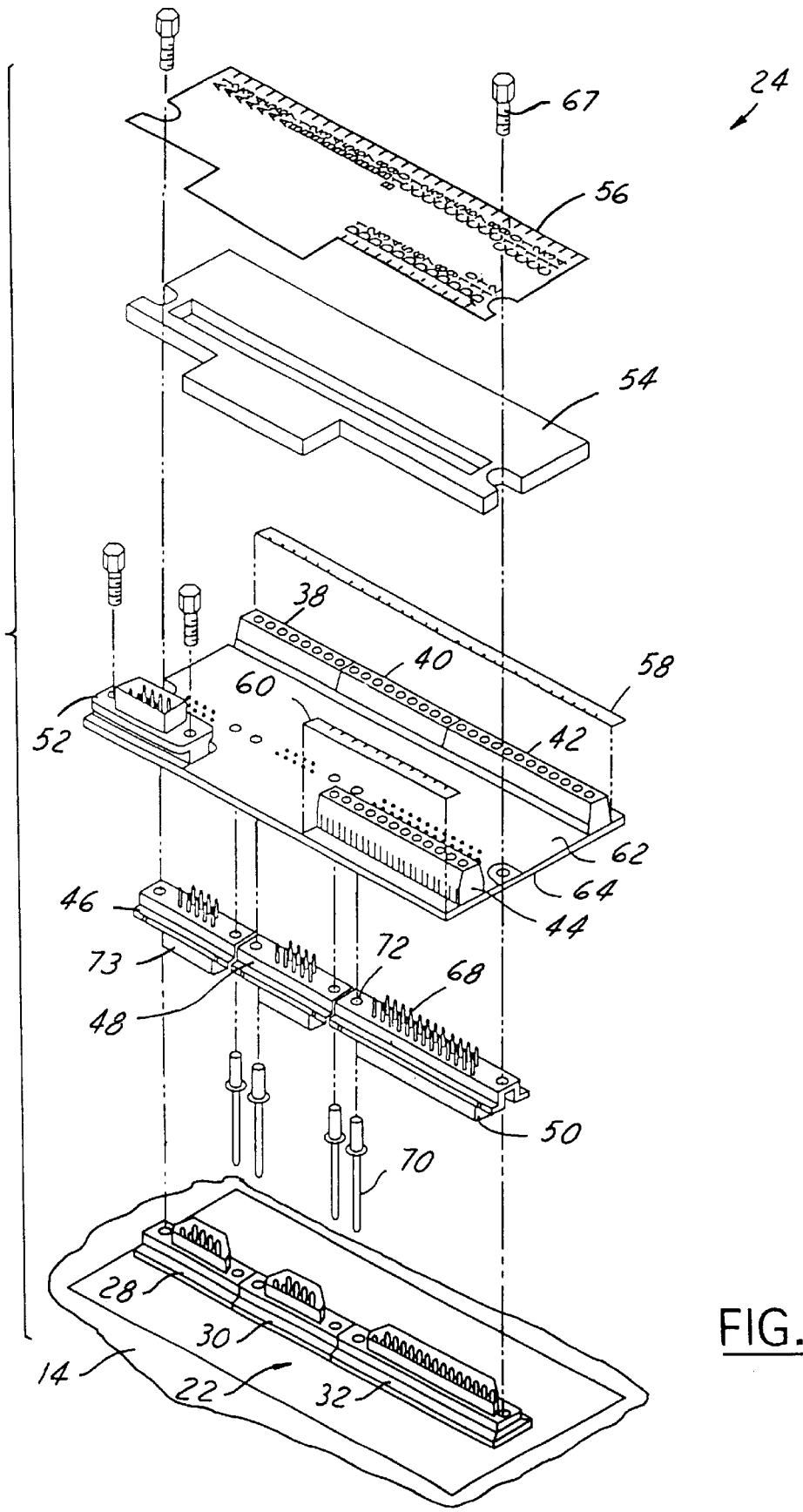
FIG. 5 is an exploded view of an adapter in accordance with the present invention.

Referring now to FIGS. 3 through 5, adapter 24 will be described in greater detail. Adapter 24 is provided to allow individual wiring and control of the input signals transmitted to unit 14 and the output signals received from unit 14. Adapter 24 may include a circuit board 36, terminal strips 38, 40, 42, 44, mass-termination connectors 46, 48, 50, 52, a spacer 54, and one or more graphical overlays 56, 58, 60.

Circuit board 36 is provided to transmit electrical signals from terminal strips 38, 40, 42, 44 and connector 52 to connectors 46, 48, 50. Board 36 may be comprised of fiberglass and has a first side 62 and a second side 64 opposite side 62. Board 36 may include conduction paths 66 extending from terminal strips 38, 40, 42, 44 and connector 52 to connectors 46, 48, 50. Paths 66 may comprise copper traces as is conventional in the art. In the illustrated embodiment, paths 66 extend between terminal strip 38 and connector 46, connector 52 and connector 46, terminal strip 40 and connector 48, and terminal strips 42, 44 and connector 50. It should be understood, however, that terminal strips 38, 40, 42, 44 and connectors 46, 48, 50, 52 may be connected in various configurations. Board 36 may be mounted to unit 14 by screws 67, rivets, or other fastening means.

Terminal strips 38, 40, 42, 44 are provided to allow individual wiring and control of the input signals transmitted to unit 14 and the output signals received from unit 14. Terminal strips 38, 40, 42, 44 are conventional in the art and may comprise a plurality of screw terminals 64. In the illustrated embodiment there are four terminal strips with three terminal strips disposed along one edge of side 62 and one terminal strip disposed along a second, opposite edge of side 62. It should be understood, however, that the number and location of the terminal strips may vary.

Mass-termination connectors 46, 48, 50 are provided to directly engage connectors 28, 30, 32, respectively, of interface 22 to thereby allow signals to be transmitted from terminal strips 38, 40, 42, 44 and/or connector 52 to connectors 28, 30, 32 and control circuit 18. Connectors 46, 48, 50 are conventional in the art and may comprise subminiature D connectors. Each of connectors 46, 48, 50 has a plurality of connection members 68 that are configured to matingly engage corresponding connection members 34 of connectors 28, 30, 32. In the illustrated embodiment, each of members 68 comprises a pin configured to be received within a corresponding member 34. It should be understood, however, that members 68 may comprise either pins or sockets (or another means of connection) depending upon the configuration of members 34 of connectors 28, 30, 32. Connectors 46, 48, 50 may be connected to board 36 by rivets 70. One end of each rivet 70 may extend through a corresponding hole 72 in one of connectors 46, 48, 50 and through board 36. The other end of each rivet 70 may extend into housing 20 of unit 14. Rivets 70 may aid in grounding the connections between connectors 28, 30, 32 and connectors 46, 48, 50. Each of connectors 46, 48, 50 may include a shield 73 disposed about connection members 68 to reduce electromagnetic interference between adapter 24 and unit 14.

Connector 52 is provided to give a user of adapter 24 the option to transmit input signals and receive output signals individually through terminal strip 38 or together through connector 52. Connector 52 is disposed on side 62 of board 36 and may comprise a subminiature D connector. As mentioned hereinabove, a plurality of conduction paths 66 may extend between connector 52 and connector 46. Also as mentioned hereinabove, conduction paths 66 may extend between terminal strip 38 and connector 46. As a result, a user of unit 10 may send input signals to and receive output signals from unit 14 using either terminal strip 38 or mass-termination. connector 52. In this manner connector 52 furthers one of the objects of the present invention—to enable a user of unit 14 to easily alternate between the use of mass-termination connectors and terminal strips to send input signals to and receive output signals from unit 14.

Spacer 54 is provided to allow overlay 56 to be mounted to board 36 without interference from connection members 68 of connectors 46, 48, 50. Spacer 54 may be made from a conventional foam material and may be disposed between side 62 of board 36 and overlay 56.

Graphical overlays 56, 58, 60 are provided to identify the individual screw terminals on terminal strips 38, 40, 42, 44. Overlays 56, 58, 60 are conventional in the art and may include an adhesive to securely affix overlay 56 to spacer 54 and overlays 58, 60 to board 36.

An adapter and a control unit in accordance with the above-described invention represent a significant improvement compared to conventional adapters and control units. Because adapter 24 directly engages interface 22 of unit 14, adapter 24 requires fewer parts than conventional adapters. As a result, adapter 24 is less costly in terms of materials and time of assembly. Because adapter 24 can be mounted directly onto interface 22, adapter 24 also consumes less space than conventional adapters which are generally mounted to another wall of unit 14 and have cables extending to the interface. Finally, because adapter 24 is mounted directly onto interface 22, less electromagnetic interference is generated by the connection between adapter 24 and unit 14 as compared to conventional adapters and control units.

While the invention has been particularly shown and described with reference to the preferred embodiments thereof, it is well understood by those skilled in the art that various changes and modifications can be made in the invention without departing from the spirit and scope of the invention.

We claim:

1. An adapter for a control unit, comprising:

a circuit board having a first side and a second side opposite said first side;

a terminal strip disposed on said first side of said circuit board;

a first mass-termination connector disposed on said second side of said circuit board, said first mass-termination connector having a first plurality of connection members configured to directly and matingly engage a second plurality of connection members of a second mass-termination connector disposed on a wall of said control unite and, a third mass-termination connector disposed on a first side of said circuit board wherein said circuit board includes a first plurality of conduction paths extending from said first mass-termination connector to said terminal strip and a second plurality of conduction paths extending from said first mass-termination connector to said third mass-termination connector.

2. The adapter of claim 1, further comprising:

a graphical overlay; and, a spacer disposed between said overlay and said circuit board.

3. The adapter of claim 1 wherein said first mass-termination connector comprises a subminiature D connector.

4. The adapter of claim 1 wherein said terminal strip comprises a plurality of screw terminals.

5. The adapter of claim 1 wherein each of said first plurality of connection members comprises a pin and each of said second plurality of connection members comprises a socket.

6. The adapter of claim 1 wherein each of said first plurality of connection members comprises a socket and each of said second plurality of connection members comprises a pin.

7. An adapter for a motor control unit, comprising:

a circuit board having a first side and a second side opposite said first side;

a terminal strip comprising a plurality of screw terminals disposed on said first side of said circuit board;

a first mass-termination connector disposed on said second side of said circuit board, said first mass-termination connector having a first plurality of connection members configured to directly and matingly engage a second plurality of connection members of a second mass-termination connector disposed on a wall of said motor control unit;

a third mass-termination connector disposed on said first side of said circuit board: and, a rivet coupling said first and second mass-termination connectors, said rivet having a first end extending through an aperture in said first mass-termination connector and a second end configured to be received by said control unit wherein said circuit board includes a first plurality of conduction paths extending between said plurality of screw terminals and said first plurality of connection members of said first mass-termination connector and a second plurality of conduction paths extending between a third plurality of connection members of said third mass-termination connector and said first plurality of connection members of said first mass-termination connector.

8. The adapter of claim 7, further comprising:

a graphical overlay; and, a spacer disposed between said overlay and said circuit board.

9. The adapter of claim 7 wherein said first mass-termination connector comprises a subminiature D connector.

10. The adapter of claim 7 wherein each of said first plurality of connection members comprises a pin and each of said second plurality of connection members comprises a socket.

11. The adapter of claim 7 wherein each of said first plurality of connection members comprises a socket and each of said second plurality of connection members comprises a pin.

12. A motor control unit, comprising:

a housing;

a control circuit disposed within said housing;

an interface disposed on one wall of said housing, said interface including a first mass-termination connector having a first plurality of connection members; and, a removable adapter comprising a circuit board having a first side and a second side opposite said first side;

a first terminal strip disposed on said first side of said circuit board;

a second mass-termination connector disposed on said second side of said circuit board and having a second plurality of connection members directly and matingly engaging said first plurality of connection members; and, a third mass-termination connector disposed on said first side of said circuit board wherein said first terminal strip comprises a plurality of screw terminals and said circuit board includes a first plurality of conduction paths extending between said plurality of screw terminals and said second plurality of connection members and a second plurality of conduction paths extending between a third plurality of connection members of said third mass-termination connector and said second plurality of connection members.

13. The motor control unit of claim 12 wherein each of said first plurality of connection members comprises a socket and each of said second plurality of connection member comprises a pin.

* * * * *

UNITED STATES PATENT AND TRADEMARK OFFICE
CERTIFICATE OF CORRECTION

PATENT NO.   : 6,106,307
DATED        : August 22, 2000
INVENTOR(S)  : Goslicki, Jr. et al.

It is certified that error appears in the above-identified patent and that said Letters Patent is hereby corrected as shown below:

In claim 1, line 12, delete "unite" and substitute "unit" therefor.

Signed and Sealed this

Nineteenth Day of December, 2000

Attest:

Q. TODD DICKINSON

Attesting Officer

Commissioner of Patents and Trademarks